(12) United States Patent
Watamura et al.

(10) Patent No.: US 10,863,635 B2
(45) Date of Patent: Dec. 8, 2020

(54) PORTABLE INFORMATION DEVICE

(71) Applicant: LENOVO (SINGAPORE) PTE. LTD., Singapore (SG)

(72) Inventors: Kenji Watamura, Kanagawa (JP); Fumitake Mizoguchi, Kanagawa (JP); Takehito Yamauchi, Kanagawa (JP); Kazuya Tatsuno, Kanagawa (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/750,238

(22) Filed: Jan. 23, 2020

(65) Prior Publication Data

US 2020/0275563 A1 Aug. 27, 2020

(30) Foreign Application Priority Data

Feb. 26, 2019 (JP) .................... 2019-032373

(51) Int. Cl.
| | |
|---|---|
| *G06F 1/16* | (2006.01) |
| *H05K 5/00* | (2006.01) |
| *H05K 7/00* | (2006.01) |
| *H05K 7/18* | (2006.01) |
| *E05D 3/14* | (2006.01) |

(52) U.S. Cl.
CPC ............ *H05K 5/0017* (2013.01); *E05D 3/14* (2013.01); *G06F 1/1626* (2013.01); *G06F 1/1652* (2013.01); *G06F 1/1681* (2013.01); *H05K 7/18* (2013.01)

(58) Field of Classification Search
CPC ...... H05K 5/0017; H05K 7/18; G06F 1/1626; G06F 1/1652; G06F 1/1681; G06F 1/1616
See application file for complete search history.

(56) References Cited

U.S. PATENT DOCUMENTS

| | | | |
|---|---|---|---|
| 6,952,340 B2 | 10/2005 | Son et al. | |
| 8,842,425 B2 * | 9/2014 | Ryu | H04M 1/0268 361/679.27 |
| 9,342,106 B2 * | 5/2016 | Nurmi | G06F 1/1652 |
| 9,710,033 B2 * | 7/2017 | Yamazaki | G06F 3/044 |

(Continued)

FOREIGN PATENT DOCUMENTS

| | | |
|---|---|---|
| JP | 20160081387 A | 5/2016 |
| JP | 20180185725 A | 11/2018 |
| JP | 2019-067279 A | 4/2019 |

*Primary Examiner* — Anthony M Haughton
(74) *Attorney, Agent, or Firm* — Antony P. Ng; Russell Ng PLLC

(57) ABSTRACT

A portable information device that can stably support a display is disclosed. The portable information device includes a first chassis member; a second chassis member; a hinge mechanism; a display whose back surface is supported by front surfaces of a first support plate and a second support plate; an alignment part that aligns the front surfaces between one edge of the first support plate and one edge of the second support plate adjacent to each other, in a flat form; a first support part that supports the first support plate relative to the first chassis member; and a second support part that supports the second support plate relative to the second chassis member. At least one of the first support part and the second support part includes a floating part that supports a corresponding support plate relative to a corresponding chassis member in a floating state.

12 Claims, 8 Drawing Sheets

(56) References Cited

U.S. PATENT DOCUMENTS

| | | | | |
|---|---|---|---|---|
| 9,964,995 B1* | 5/2018 | Morrison | ............... | G06F 1/1622 |
| 10,013,027 B2* | 7/2018 | Sun | ........................... | G06F 1/16 |
| 10,082,839 B1* | 9/2018 | Turchin | ................ | G06F 1/1681 |
| 10,091,896 B2* | 10/2018 | Chu | ....................... | G06F 1/1652 |
| 10,209,746 B2* | 2/2019 | Baek | ..................... | G06F 1/1675 |
| 10,234,899 B1* | 3/2019 | Brocklesby | ............ | G06F 1/1616 |
| 10,274,996 B2* | 4/2019 | Lin | ........................... | E05F 5/08 |
| 10,327,346 B2* | 6/2019 | Zhang | ................. | H05K 5/0017 |
| 10,545,537 B2* | 1/2020 | Ahn | ....................... | B32B 27/08 |
| 10,705,563 B2* | 7/2020 | Lin | ....................... | G06F 1/1681 |

* cited by examiner

PORTABLE INFORMATION DEVICE

PRIORITY CLAIM

The present application claims benefit of priority under 35 U.S.C. §§ 120, 365 to the previously filed Japanese Patent Application No. JP2019-032373 with a priority date of Feb. 26, 2019, which is incorporated by reference herein.

TECHNICAL FIELD

The present invention relates to portable information devices in general, and in particular to a portable information device having a pair of foldable chassis members.

BACKGROUND

Portable information devices having touch-panel liquid crystal displays without physical keyboards, such as tablet personal computers (PCs) and smart phones, have rapidly come into wide use in recent years. The display in this type of portable information device is desired to be large during use but compact during carrying. Hence, a portable information device in which a flexible display of organic electroluminescence (EL) or the like is used to make not only the chassis but also the display foldable is developed.

For example, a structure in which two support plates for supporting a display can be provided at the inner surfaces of two chassis members and locking pieces engaging in a comb-like manner are provided between the support plates to suppress a level difference between the plates. With this structure, a level difference between the longitudinal centers of the adjacent edges of the support plates can be suppressed by action of the locking pieces. At both longitudinal ends of the adjacent edges of the support plates; however, the support plates and hinge chassis are fixed rigidly. Therefore, when there is a level difference between the chassis members or between the hinge chassis due to, for example, manufacturing tolerances or assembly tolerances of components, the influence of such level difference may be exerted between the support plates and cause waviness, curving, etc. of the display.

Consequently, it would be desirable to provide an improved portable information device that can stably support a display.

SUMMARY

In accordance with an embodiment of the present disclosure, a portable information device includes a first chassis member; a second chassis member adjacent to the first chassis member; a hinge mechanism that rotatably connects adjacent edges of the first chassis member and the second chassis member, to change a form between the first chassis member and the second chassis member between a flat form in which the first chassis member and the second chassis member are arranged side by side and a stacked form in which the first chassis member and the second chassis member are overlapped so that inner surfaces thereof face each other; a first support plate located at an inner surface of the first chassis member and attached to the first chassis member; a second support plate located at an inner surface of the second chassis member to be adjacent to the first support plate, and attached to the second chassis member; a display whose back surface is supported by front surfaces of the first support plate and the second support plate; an alignment part that aligns the front surfaces between one edge of the first support plate and one edge of the second support plate adjacent to each other, in the flat form; a first support part that supports the first support plate relative to the first chassis member; and a second support part that supports the second support plate relative to the second chassis member, wherein at least one support part from among the first support part and the second support part includes a floating part that supports a corresponding support plate relative to a corresponding chassis member in a floating state.

With such a structure, the front surfaces of the support plates are aligned by the alignment part. Moreover, at least one of the support plates includes the floating part in the support part for the chassis member. Hence, even when there is a level difference between the attachment parts of the support plates due to manufacturing tolerances or assembly tolerances of the chassis members or the like, the influence of the level difference is absorbed by the floating part. As a result, the portable information device can reliably support the support plates by the chassis members while maintaining flatness between the support plates aligned by the alignment part. The portable information device can thus support the display more stably.

The first support part and the second support part may each include the floating part. Thus, a level difference between the support plates is absorbed by the floating parts corresponding to the support plates, so that the level difference can be further suppressed.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

I. Overall Structure of Portable Information Device

Figure 1:
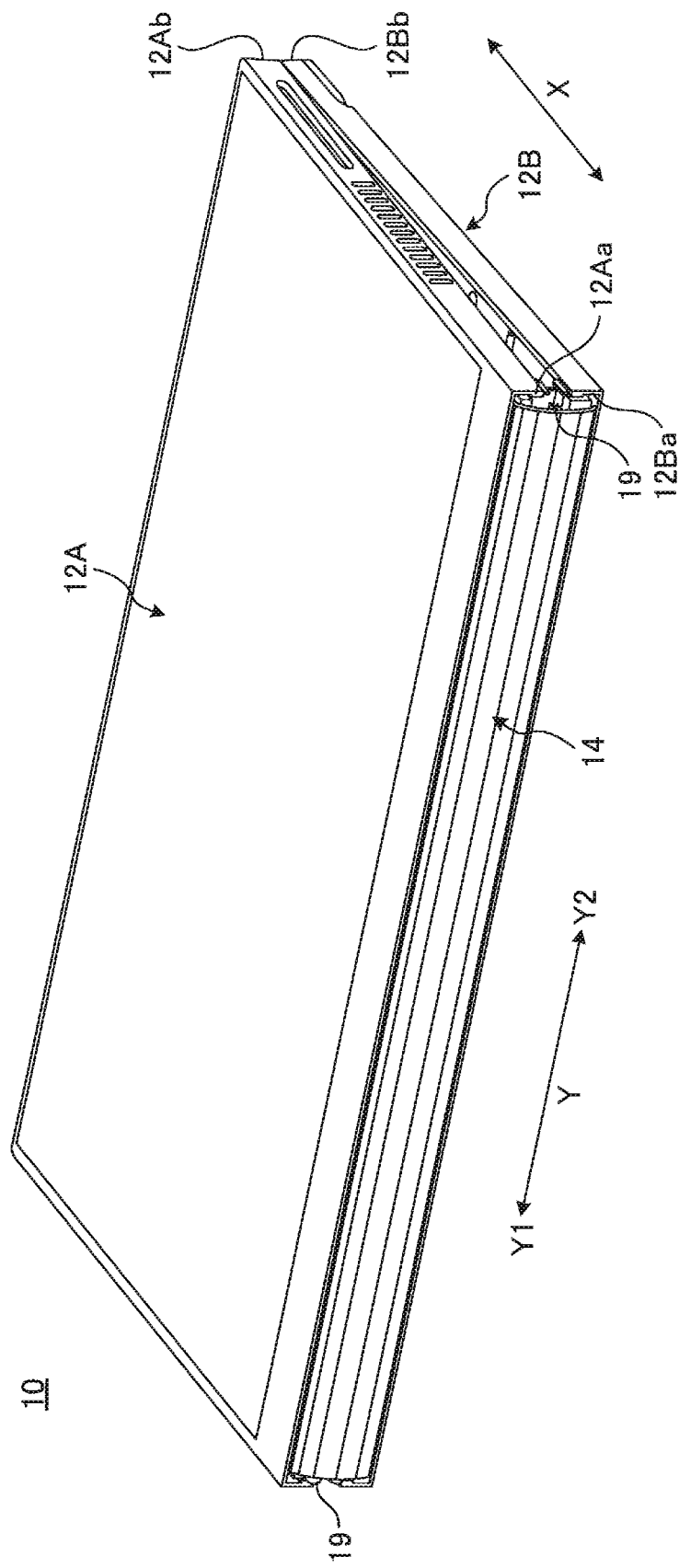
FIG. 1 is a perspective view illustrating a state in which a portable information device is closed to be in storage form.
Figure 2:
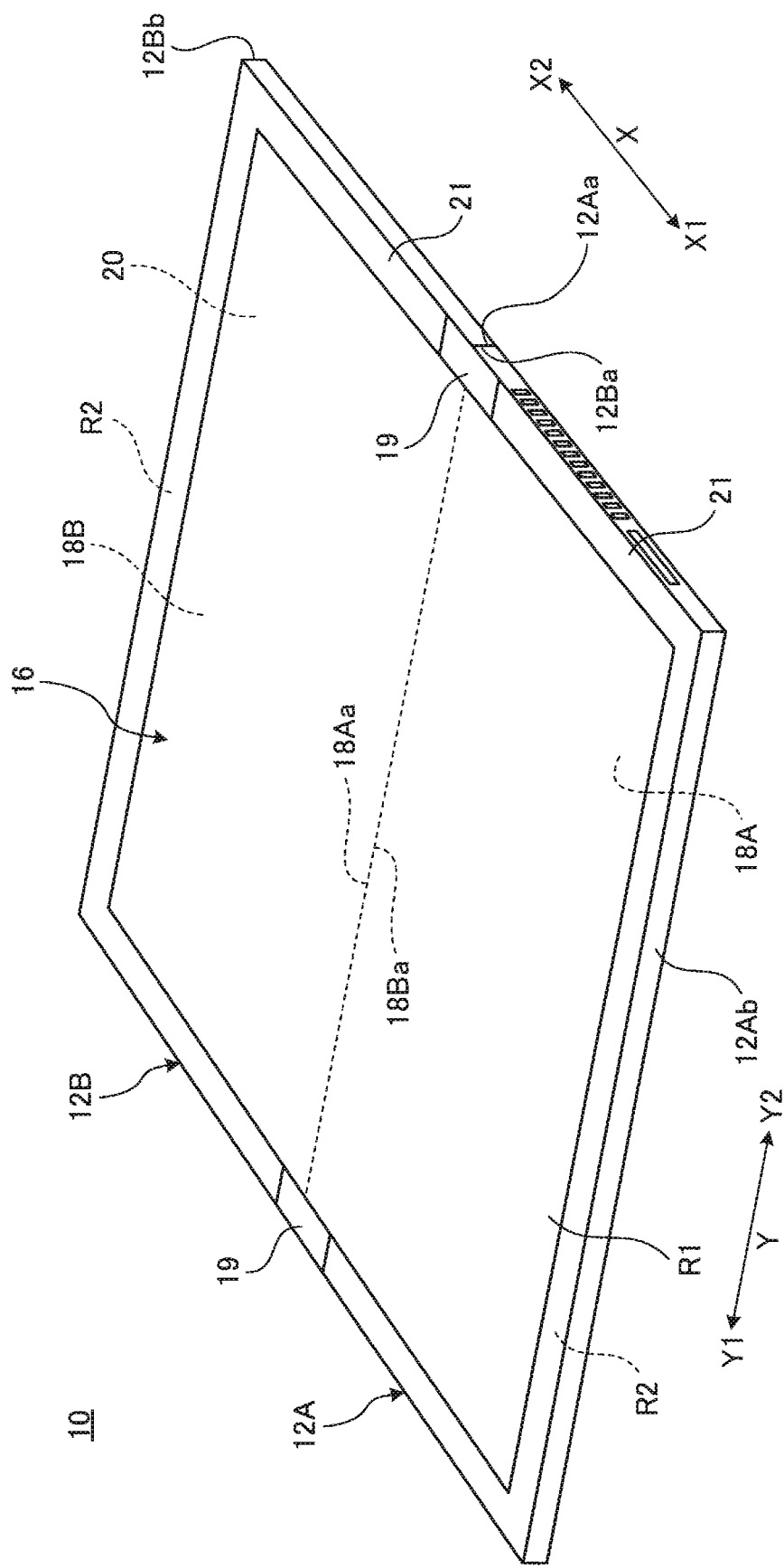
FIG. 2 is a perspective view illustrating a state in which the portable information device illustrated in FIG. 1 is opened to be in use form.

FIG. 1 is a perspective view illustrating a state in which a portable information device 10 according to an embodiment is closed to be in storage form. FIG. 2 is a perspective view illustrating a state in which the portable information device 10 illustrated in FIG. 1 is opened to be in use form.

Figure 3:
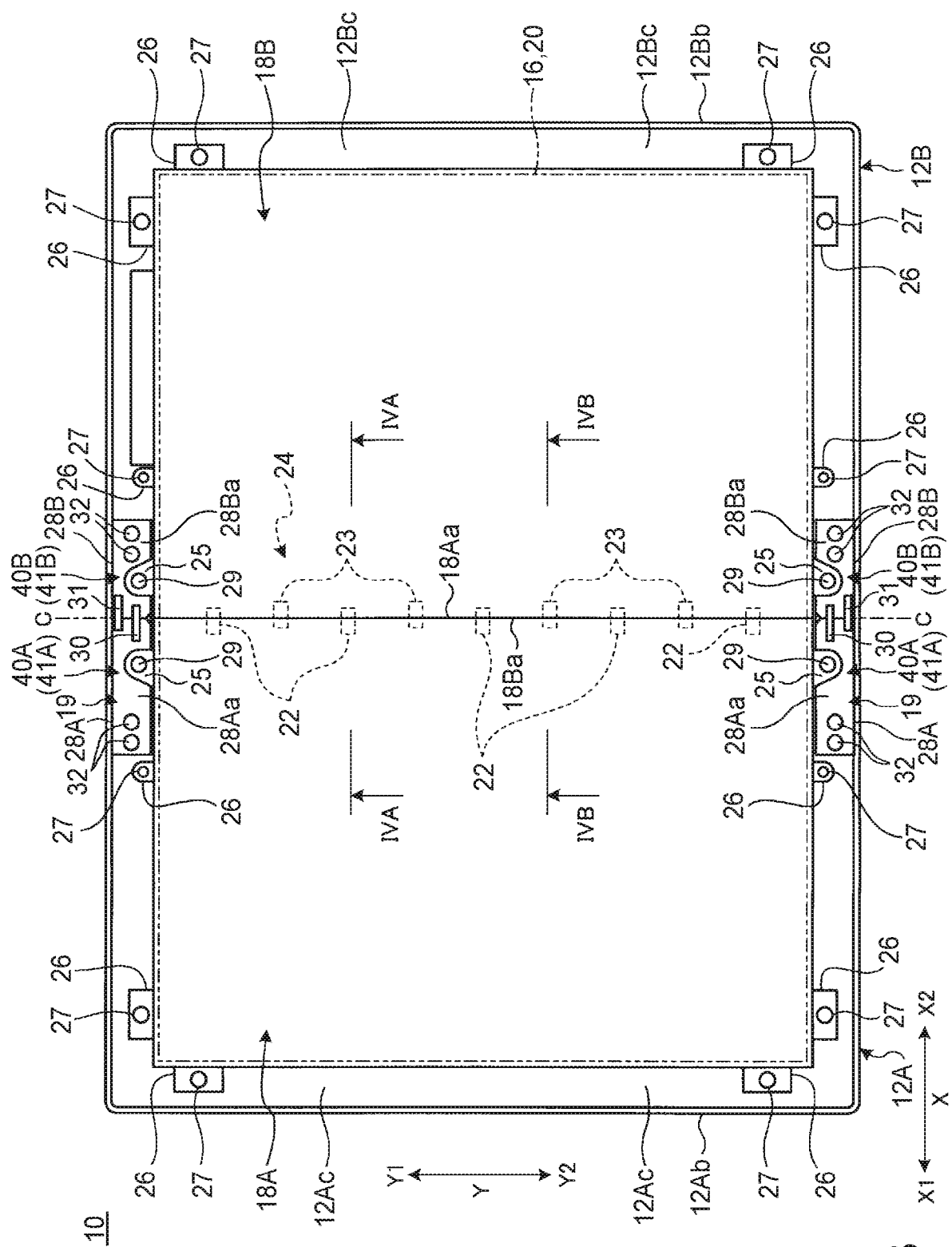
FIG. 3 is a plan view illustrating the internal structure of the portable information device illustrated in FIG. 2.

FIG. 3 is a plan view illustrating the internal structure of the portable information device 10 illustrated in FIG. 2.

As illustrated in FIGS. 1 and 2, the portable information device 10 includes a first chassis member 12A, a second chassis member 12B, a back cover member 14, and a display 16. In this embodiment, a clamshell tablet PC foldable like a book is used as the portable information device 10. The portable information device 10 may be a mobile phone, a smartphone, an electronic organizer, a portable game machine, or the like.

The chassis members 12A and 12B are each a rectangular plate-like member having side walls standing on three sides other than the side corresponding to the back cover member 14. For example, the chassis members 12A and 12B are each a metal plate made of stainless steel, magnesium, or aluminum, or a fiber-reinforced resin plate containing reinforcement fiber such as carbon fiber. The display 16 is attached to the inner surface side of the chassis members 12A and 12B via a first support plate 18A and a second support plate 18B. The chassis members 12A and 12B are connected to each other via a pair of hinge mechanisms 19 provided at both ends of the back cover member 14. The hinge mechanisms 19 connect the chassis members 12A and 12B to be foldable between the storage form (stacked form) illustrated in FIG. 1 and the use form (flat form) illustrated in FIG. 2. Dashed-dotted line C in FIG. 3 indicates a folding center C of the folding operation of the chassis members 12A and 12B.

The chassis members 12A and 12B have, on the hinge side, back cover member 14-side edges (inner ends) 12Aa and 12Ba, and have, on the open end side, edges (outer ends) 12Ab and 12Bb on the side opposite to the back cover member 14.

In the following description, the direction from the back cover member 14 at the center to the edges 12Ab and 12Bb in the portable information device 10 is referred to as "X direction," and the direction along the longitudinal direction of the back cover member 14 is referred to as "Y direction," as illustrated in FIGS. 1 to 3. For the X direction, the direction from the back cover member 14 to the edge 12Ab may be referred to as "X1 direction," and the direction from the back cover member 14 to the edge 12Bb may be referred to as "X2 direction." Likewise, for the Y direction, the direction to one side (the upper side in FIG. 3) in the longitudinal direction of the back cover member 14 may be referred to as "Y1 direction," and the direction to the other side (the lower side in FIG. 3) in the longitudinal direction of the back cover member 14 may be referred to as "Y2 direction."

As illustrated in FIGS. 2 and 3, the first support plate 18A is attached to the inner surface 12Ac of the first chassis member 12A, and the second support plate 18B is attached to the inner surface 12Bc of the second chassis member 12B. Various components such as a substrate, a communication module, a battery device, and a cooling device are mounted on and fixed to the inner surfaces 12Ac and 12Bc of the chassis members 12A and 12B at the back of the support plates 18A and 18B.

The display 16 is, for example, a touch-panel liquid crystal display. The display 16 is foldable together with the chassis members 12A and 12B when the chassis members 12A and 12B are folded. The display 16 is installed at the inner surfaces 12Ac and 12Bc of the chassis members 12A and 12B via the support plates 18A and 18B. The display 16 is, for example, a flexible display of organic EL or the like having a highly flexible paper structure, and is opened/closed with opening/closing operation of the chassis members 12A and 12B. That is, the display 16 in this embodiment has a foldable single sheet shape extending from the first support plate 18A to the second support plate 18B.

The back cover member 14 is formed by a flexible thin plate-like member, and serves as a back cover when the portable information device 10 is folded. The back cover member 14 is provided across the boundary between the chassis members 12A and 12B so as to cover the boundary between the edges 12Aa and 12Ba from inside. When the portable information device 10 is in the storage form, the edges 12Aa and 12Ba of the chassis members 12A and 12B widely separate from each other and a gap forms between the edges 12Aa and 12Ba, as illustrated in FIG. 1. The back cover member 14 covers the gap between the edges 12Aa and 12Ba, thus preventing exposure of the display 16 and various components inside.

II. Support Plates

Figure 4A:
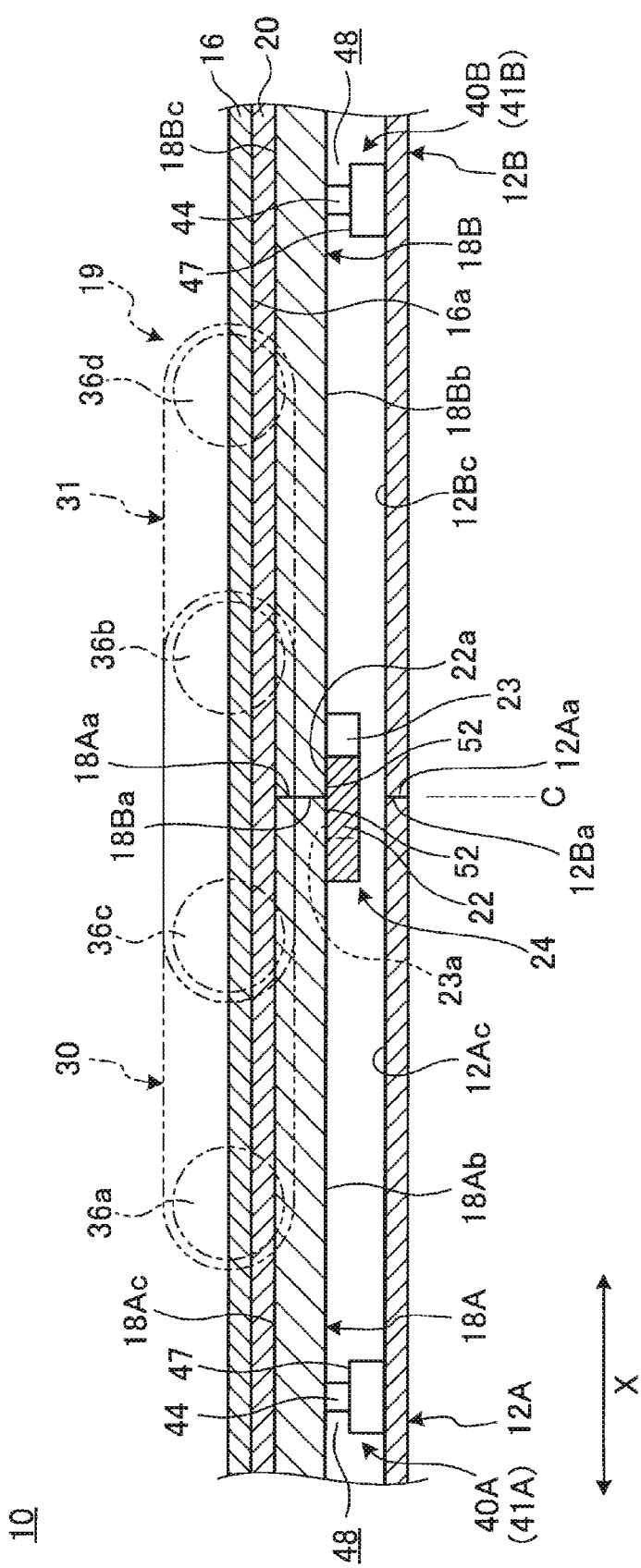
FIG. 4A is a sectional side view illustrating the state of support plates and hinge mechanisms in the use form.
Figure 4B:
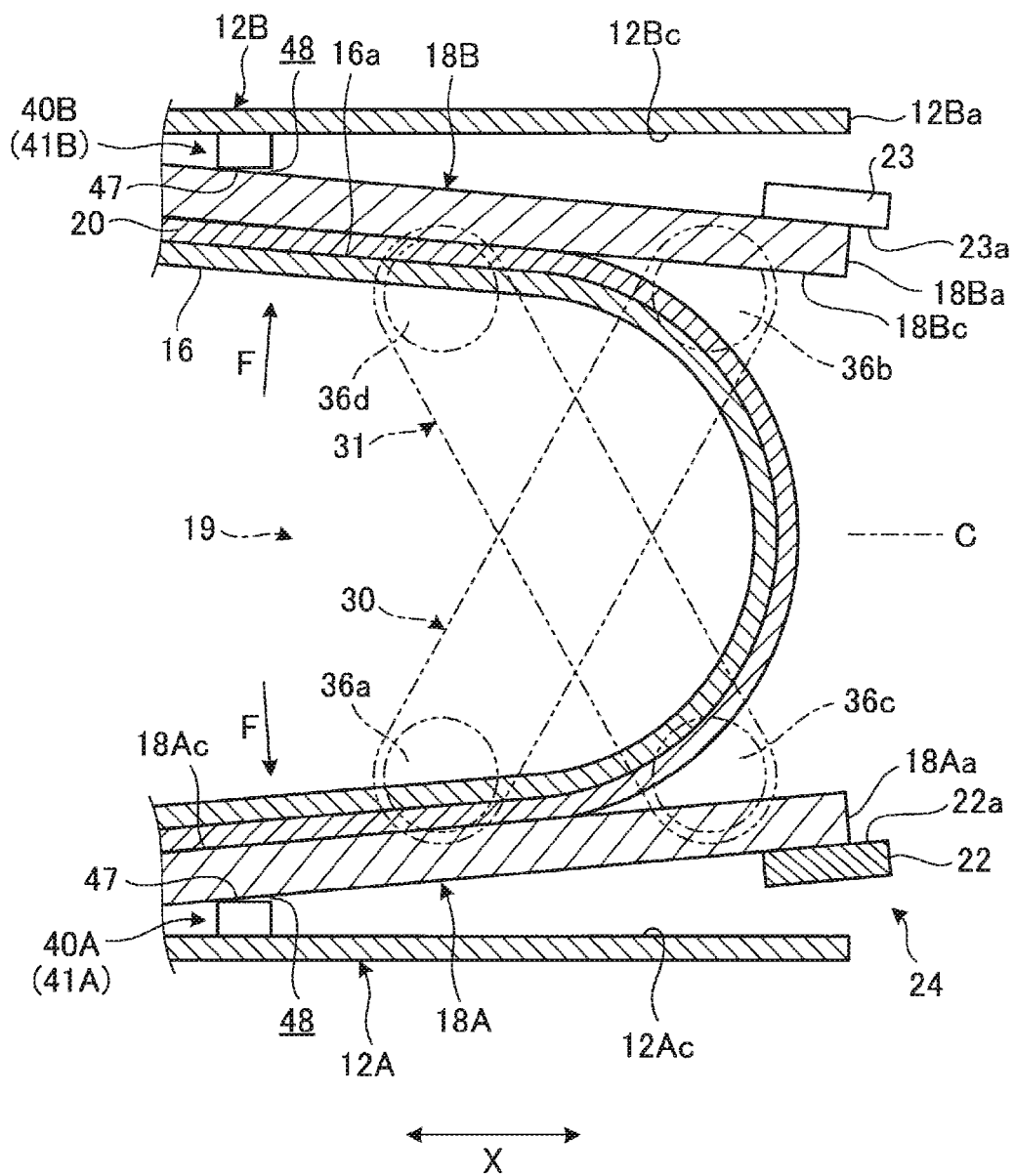
FIG. 4B is a sectional side view in a state in which chassis members are closed to be in the storage form from the state illustrated in FIG. 4A.
Figure 5:
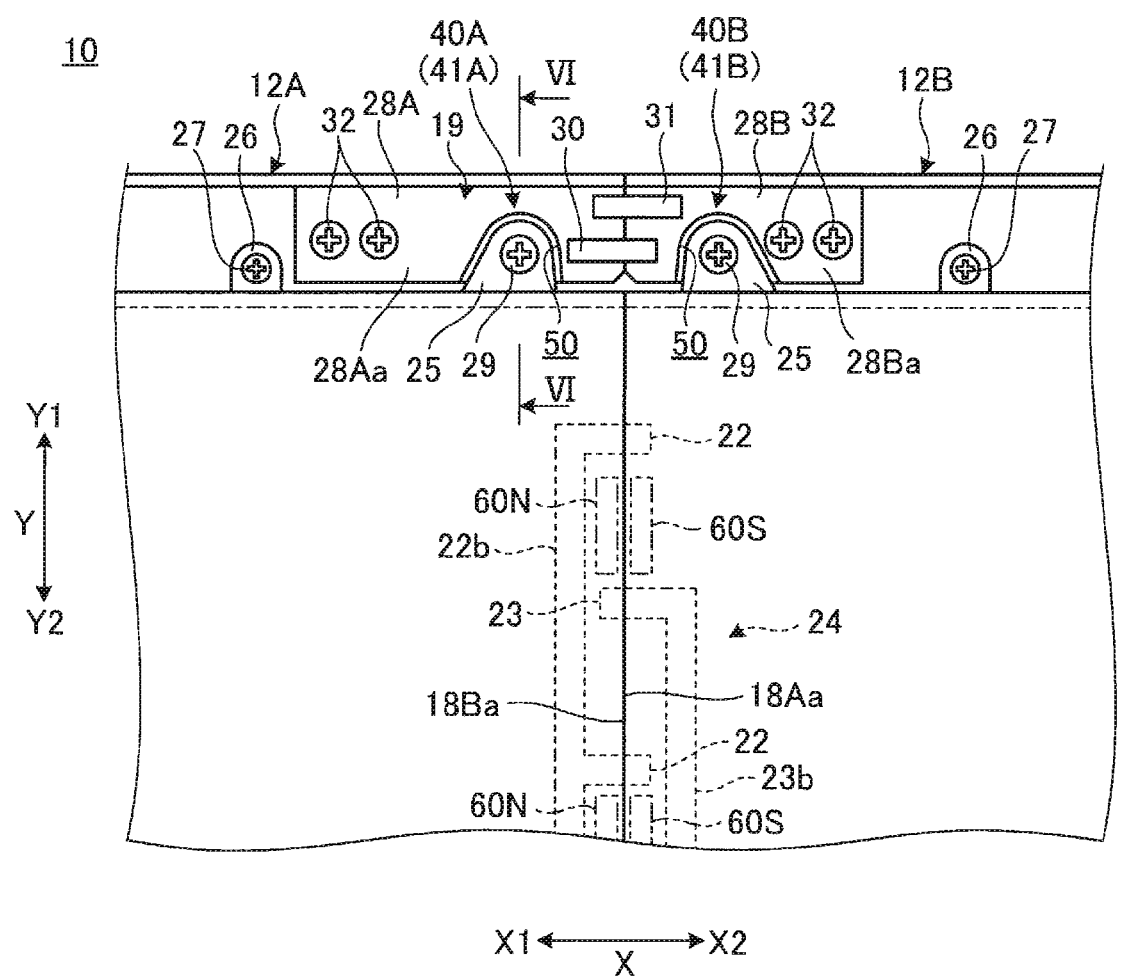
FIG. 5 is an enlarged plan view of one hinge mechanism and its surroundings in the portable information device illustrated in FIG. 3.

An example of the structure of the support plates 18A and 18B for supporting the display 16 will be described below. FIG. 4A is a sectional side view illustrating the state of the support plates 18A and 18B and the hinge mechanism 19 in the use form. FIG. 4B is a sectional side view in a state in which the chassis members 12A and 12B are closed to be in the storage form from the state illustrated in FIG. 4A. FIG. 5 is an enlarged plan view of one hinge mechanism 19 and its surroundings in the portable information device 10 illustrated in FIG. 3.

As illustrated in FIGS. 4A and 4B, the support plates 18A and 18B are plate members for supporting the back surface 16a of the display 16 by their front surfaces 18Ac and 18Bc. The support plates 18A and 18B are respectively supported on the inner surfaces 12Ac and 12Bc of the chassis members 12A and 12B, and are opened/closed like a book about the folding center C. In this embodiment, the support plates 18A and 18B support the display 16 via the sheet-like member 20.

Each of the support plates 18A and 18B is, for example, a metal plate of stainless steel, magnesium, aluminum, or the like, or a fiber-reinforced resin plate obtained by impregnating reinforcement fiber such as carbon fiber with matrix resin made up of thermosetting resin, thermoplastic resin, or the like. In this embodiment, the support plates 18A and 18B are each formed by a carbon fiber-reinforced resin plate (CFRP) obtained using carbon fiber as reinforcement resin. In this embodiment, the adjacent edges (inner ends) 18Aa and 18Ba of the support plates 18A and 18B are in contact with each other in the use form (see FIG. 4A), and are separate from each other in the storage form (see FIG. 4B).

The sheet-like member 20 is a thin film made of a flexible material such as a thin resin film or metal foil. The sheet-like member 20 is located on the entire front surfaces 18Ac and 18Bc of the left and right support plates 18A and 18B across their boundary. The back surface of the sheet-like member 20 is pasted and fixed to the front surfaces of the support plates 18A and 18B using an adhesive, double-sided tape, or the like. One part of the sheet-like member 20 across the boundary between the edges 18Aa and 18Ba in the X direction (i.e. a belt-like part whose short side is in the X direction and long side is in the Y direction) is an unbonded part not fixed to the front surfaces 18Ac and 18Bc of the support plates 18A and 18B (see FIG. 4B).

The unbonded part of the sheet-like member 20 functions as a bent part (flexible hinge) between the support plates 18A and 18B.

The display 16 has approximately its entire back surface 16a pasted and fixed to the front surface of the sheet-like member 20 using an adhesive, double-sided tape, or the like. As illustrated in FIG. 2, a bezel member 21 is located at the peripheral edges of the front surface of the display 16. The bezel member 21 is provided to cover a non-display region (inactive region) R2 at the peripheral edges except a display region (active region) R1 of the front surface of the display 16. The display 16 may be pasted and fixed directly to the front surfaces 18Ac and 18Bc of the support plates 18A and 18B, without using the sheet-like member 20. In this structure, a part of the display 16 across the boundary between the edges 18Aa and 18Ba in the X direction is an unbonded part not fixed to the support plates 18A and 18B. For example, the display 16 may be a dual display with two screens that is composed of a first display supported by the first support plate 18A and a second display supported by the second support plate 18B.

As illustrated in FIG. 3, an alignment part 24 including a plurality of first locking pieces 22 and second locking pieces 23 is provided between the edges 18Aa and 18Ba of the support plates 18A and 18B.

As illustrated in FIGS. 3 to 5, each first locking piece 22 is a plate piece-like member fixed to the back surface 18Ab of the first support plate 18A. A plurality of (five in FIG. 3) first locking pieces 22 are arranged with predetermined spacing along the edge 18Aa of the first support plate 18A. Proximal end parts of the first locking pieces 22 are integrated in a comb-like manner via a connection part 22b extending in the Y direction. The back surfaces of the proximal end parts of the first locking pieces 22 and the back surface of the connection part 22b are bonded and fixed to the back surface 18Ab of the first support plate 18A using an adhesive, double-sided tape, or the like. The distal end of each first locking piece 22 protrudes across the edges 18Aa and 18Ba in the X2 direction, and extends to a position at which the distal end can come into contact with the back surface 18Bb of the second support plate 18B.

Each second locking piece 23 is a plate piece-like member fixed to the back surface 18Bb of the second support plate 18B. A plurality of (four in FIG. 3) second locking pieces 23 are arranged with predetermined spacing along the edge 18Ba of the second support plate 18B, so as to be each situated between adjacent first locking pieces 22. Proximal end parts of the second locking pieces 23 are integrated in a comb-like manner via a connection part 23b, and bonded and fixed to the back surface 18Bb of the support plate 18B. The distal end of each second locking piece 23 protrudes across the edges 18Ba and 18Aa in the X1 direction, and extends to a position at which the distal end can come into contact with the back surface 18Ab of the first support plate 18A.

Thus, the locking pieces 22 and 23 alternate in the Y direction and protrude to the opposite side in the X direction, thus forming a structure in which comb teeth engage with each other across the edges 18Aa and 18Ba. The front surfaces 22a and 23a of the locking pieces 22 and 23 come into contact with or separate from the back surfaces 18Ab and 18Bb of the support plates 18A and 18B on the other side with opening/closing operation of the chassis members 12A and 12B. The number of pairs of a first locking piece 22 and a second locking piece 23 is one or more.

As illustrated in FIG. 3, the support plates 18A and 18B are attached to the inner surfaces 12Ac and 12Bc of the chassis members 12A and 12B via a plurality of attachment parts 25 and 26 protruding from their peripheral edges. The attachment parts 25 and 26 are protrusion pieces protruding outward from the peripheral end surfaces of the support plates 18A and 18B. Each attachment part 25 is located at a position closest to the edges 18Aa and 18Ba of the support plates 18A and 18B and overlapping with the hinge mechanism 19. A plurality of attachment parts 26 are provided at appropriate positions at the peripheral edges of the support plates 18A and 18B. The attachment parts 25 and 26 each have a through hole for screw clamp at the center.

The support plates 18A and 18B are rigidly fixed to the inner surfaces 12Ac and 12Bc of the chassis members 12A and 12B by attachment screws 27 passing through the through holes of the attachment parts 26. Meanwhile, the attachment parts 25 are attached to the inner surfaces 12Ac and 12Bc of the chassis members 12A and 12B in a floating state by attachment screws 29 passing through their through holes (the below-described hole parts 42). A floating support structure by the attachment parts 25 will be described in detail below.

III. Hinge Mechanism

An example of the structure of the hinge mechanism 19 for connecting the chassis members 12A and 12B will be described below. The hinge mechanism 19 is not limited to the below-described multi-axial hinge, and may be a uni-axial or bi-axial hinge.

As illustrated in FIG. 3, the hinge mechanism 19 is provided across the boundary between the chassis members 12A and 12B at each of the two ends in the Y direction, i.e. the Y1-side end and the Y2-side end. The hinge mechanisms 19 are each provided at a position outside the outer shape of the display 16, and are line-symmetric with respect to a straight line in the X direction through the center in the Y direction. Each hinge mechanism 19 includes a first hinge chassis 28A, a second hinge chassis 28B, a first link member 30, and a second link member 31.

The hinge chassis 28A and 28B are each a thin block-shaped component made of resin, metal, or the like. The first hinge chassis 28A is fixed to the inner surface 12Ac of the first chassis member 12A using fixing screws 32. The second hinge chassis 28B is fixed to the inner surface 12Bc of the second chassis member 12B using fixing screws 32.

The first link member 30 has one end connected to the first hinge chassis 28A so as to be rotatable via a first hinge shaft 36a, and the other end connected to the second hinge chassis 28B so as to be rotatable via a second hinge shaft 36b (see FIG. 4A). The second link member 31 has one end connected to the first hinge chassis 28A so as to be rotatable via a third hinge shaft 36c, and the other end connected to the second hinge chassis 28B so as to be rotatable via a fourth hinge shaft 36d (see FIG. 4A). The first link member 30 and the second link member 31 are arranged side by side in the Y direction. The second hinge shaft 36b of the first link member 30 is interposed between the third hinge shaft 36c and the fourth hinge shaft 36d of the second link member 31. The third hinge shaft 36c of the second link member 31 is interposed between the first hinge shaft 36a and the second hinge shaft 36b of the first link member 30. Thus, the first link member 30 and the second link member 31 are arranged shifted in the X direction and the Y direction.

When the chassis members 12A and 12B are folded about the folding center C, the link members 30 and 31 rotate via the hinge shafts 36a to 36d in each hinge mechanism 19 (see FIGS. 4A and 4B). Thus, the hinge mechanism 19 connects the chassis members 12A and 12B so as to be openable to a state in which the chassis members 12A and 12B are opened flat and closable to a state in which the chassis members 12A and 12B are clamshell-folded.

IV. Floating Support Structure of Support Plates

Figure 6:
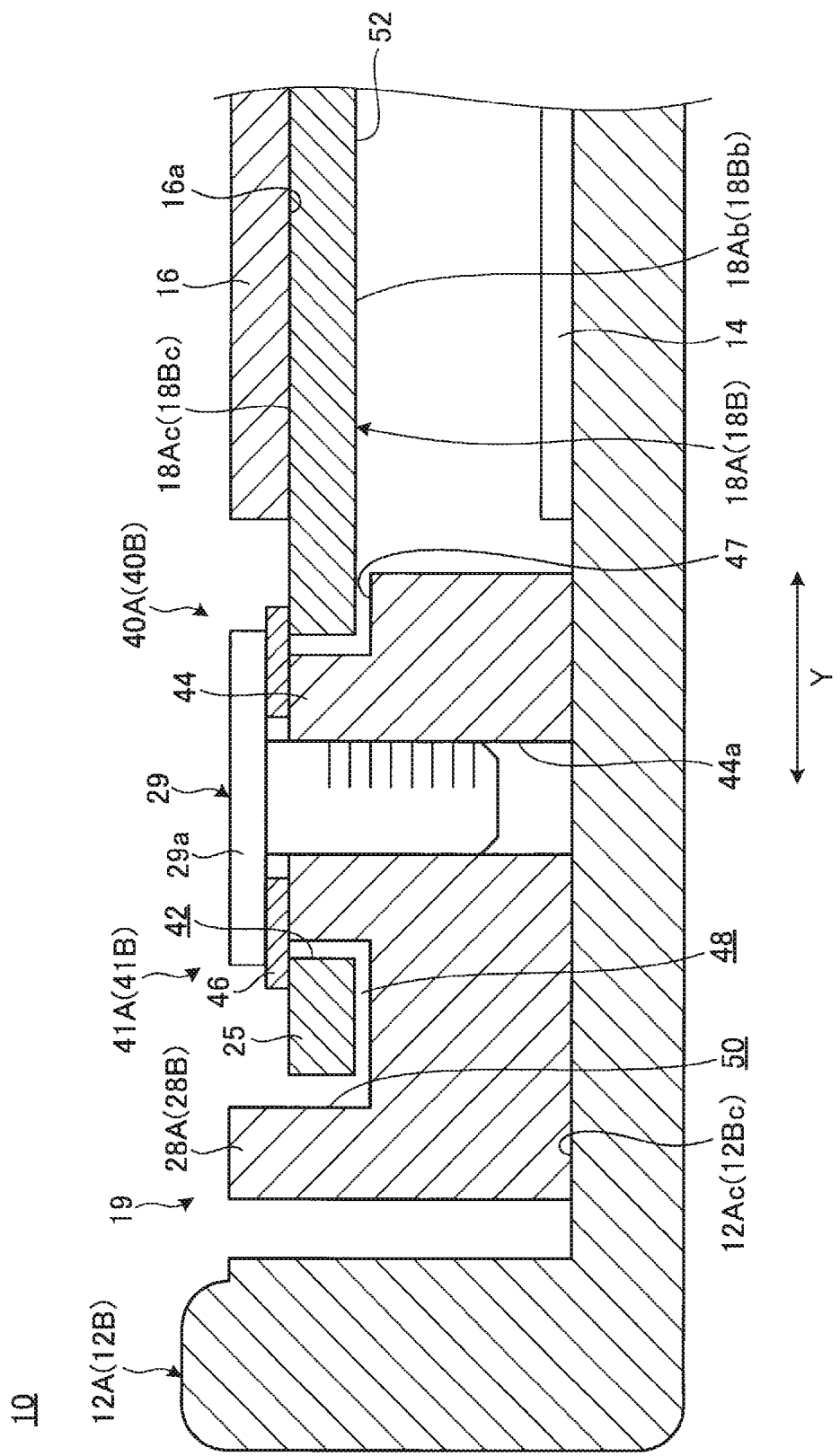
FIG. 6 is a sectional view along line VI-VI in FIG. 5.

The floating support structure of the support plates 18A and 18B will be described below. FIG. 6 is a sectional view along line VI-VI in FIG. 5.

As illustrated in FIGS. 5 and 6, the portable information device 10 in this embodiment includes a first support part 40A between the first support plate 18A and the first chassis member 12A, and a second support part 40B between the second support plate 18B and the second chassis member 12B. The support parts 40A and 40B are provided at each of the two ends of each of the edges 18Aa and 18Ba in the Y direction (see FIG. 3).

As illustrated in FIGS. 5 and 6, the first support part 40A includes a floating part 41A supporting the first support plate 18A relative to the first chassis member 12A in a floating state. The first support part 40A is provided at the attachment part 25 closest to the edge 18Aa from among the attachment parts 25 and 26 of the first support plate 18A. In this embodiment, the attachment part 25 is fastened to the front surface 28Aa of the first hinge chassis 28A by an attachment screw 29. That is, the floating part 41A of the first support part 40A provides support between the first support plate 18A and the first hinge chassis 28A in a floating state. The first hinge chassis 28A is screw-fixed to the first chassis member 12A. Therefore, the first support plate 18A is also supported on the first chassis member 12A via the first hinge chassis 28A in a floating state.

As illustrated in FIG. 6, the floating part 41A includes a hole part 42, a shaft member 44, a first stopper 46, a second stopper 47, and a gap 48. The hole part 42 is a through hole in the plate thickness direction formed in the attachment part 25 of the first support plate 18A.

The shaft member 44 is a columnar member inserted through the hole part 42 in a state of being relatively movable in the shaft direction (the vertical direction in FIG. 6). In this embodiment, a recess 50 capable of containing the attachment part 25 is formed on the front surface 28Aa of the hinge chassis 28A. The shaft member 44 is a boss part protruding from the second stopper 47 which is the bottom surface of the recess 50, and has an internal thread 44a in which the attachment screw 29 can be screwed at the shaft center. That is, the attachment part 25 is stored in the recess 50, and the shaft member 44 is inserted into the hole part 42 of the attachment part 25 in a state of being relatively movable. The attachment screw 29 may be a stepped screw as in a structural example illustrated in FIG. 7. In this case, the step part 29b of the attachment screw 29 may be brought into contact with the second stopper 47 which is the bottom surface of the recess 50 instead of the shaft member 44, to cause the step part 29b to function as the shaft member.

The first stopper 46 is a retention part for preventing the attachment part 25 of the first support plate 18A from coming off the shaft member 44 upward. The first stopper 46 in this embodiment is formed by a washer sandwiched between the head 29a of the attachment screw 29 and the top surface of the shaft member 44. In the case where the attachment screw 29 is fastened to the shaft member 44 without a washer, the head 29a of the attachment screw 29 functions as the first stopper.

The second stopper 47 is a retention part for preventing the attachment part 25 from coming off the shaft member 44 downward. The second stopper 47 in this embodiment is formed by the bottom surface of the recess 50 of the first hinge chassis 28A.

The gap 48 is an opening in which the attachment part 25 of the support plate 18A is movable along the shaft direction of the shaft member 44 between the first stopper 46 and the second stopper 47. That is, in the floating part 41A, the spacing between the first stopper 46 and the second stopper 47 is greater than the length of the hole part 42 of the attachment part 25 in the shaft direction (the plate thickness of the attachment part 25 or the first support plate 18A), and the difference therebetween is the gap 48. The floating part 41A supports the support plate 18A via the gap 48, thus allowing floating of the first support plate 18A for the gap 48.

The second support part 40B includes a floating part 41B for supporting the second support plate 18B relative to the second chassis member 12B in a floating state. The second support part 40B is provided at the attachment part 25 closest to the edge 18Ba from among the attachment parts 25 and 26 of the second support plate 18B. In this embodiment, the attachment part 25 is fastened to the front surface 28Ba of the second hinge chassis 28B by an attachment screw 29. That is, the floating part 41B of the second support part 40B provides support between the second support plate 18B and the second hinge chassis 28B in a floating state. In other words, the floating part 41B of the second support part 40B provides support between the second support plate 18B and the second chassis member 12B in a floating state.

The floating part 41B can have the same structure as the foregoing floating part 41A of the first support part 40A, and accordingly its detailed description is omitted. That is, as indicated by the parenthesized reference signs in FIG. 6, the floating part 41B of the second support part 40B equally includes the hole part 42, the shaft member 44, the first stopper 46, the second stopper 47, and the gap 48, and allows floating of the second support plate 18B for the gap 48.

V. Opening/Closing Operation of Portable Information Device and Effects

The opening/closing operation of the portable information device 10 will be described below, together with the state of the support plates 18A and 18B in each form.

When the portable information device 10 in this embodiment is in the use form in which the chassis members 12A and 12B are opened flat as illustrated in FIG. 4A, the shaft centers of the hinge shafts 36a to 36d are in the same plane, and the front surface of the display 16 coincides with this position. When the chassis members 12A and 12B are folded from the use form, the link members 30 and 31 rotate about the hinge shafts 36a to 36d, so that the chassis members 12A and 12B are gradually folded and the display 16 is also folded. This eventually results in the storage form in which the chassis members 12A and 12B are clamshell-folded so that their inner surfaces 12Ac and 12Bc face each other and the display 16 is also clamshell-folded along a circular arc of a predetermined curvature as illustrated in FIG. 4B.

In this opening/closing operation, first, in the use form illustrated in FIG. 4A, the front surface 22a of each first locking piece 22 in the alignment part 24 comes into contact with the back surface 18Bb of the second support plate 18B, and simultaneously the front surface 23a of each second locking piece 23 in the alignment part 24 comes into contact with the back surface 18Ab of the first support plate 18A. Hence, the alignment part 24 is in a state in which the locking pieces 22 and 23 protruding from the support plates 18A and 18B are in contact with the back surfaces 18Bb and 18Ab on the other side to restrict each other in a balanced manner. Accordingly, in the use form, a level difference between the edges 18Aa and 18Ba of the support plates 18A and 18B is suppressed, and the display 16 can be stably supported. Consequently, viewing defects, display defects, etc. as a result of the display 16 curving or becoming wavy in the use form can be prevented.

Here, the longitudinal centers of the edges 18Aa and 18Ba of the support plates 18A and 18B and their surroundings form a float part 52 in a state of floating from the inner surfaces 12Ac and 12Bc of the chassis members 12A and 12B. The alignment part 24 in this embodiment aligns the support plates 18A and 18B by this float part 52. The alignment part 24 can thus prevent a level difference between the support plates 18A and 18B more reliably and smoothly.

Meanwhile, both longitudinal ends of the edges 18Aa and 18Ba of the support plates 18A and 18B are supported by the chassis members 12A and 12B via the attachment parts 25. In the case where the attachment parts 25 do not have the foregoing floating parts 41A and 41B, if there is a level difference between the chassis members 12A and 12B or between the hinge chassis 28A and 28B, the level difference is transmitted to the support plates 18A and 18B via the attachment parts 25. Consequently, a level difference or distortion between the support plates 18A and 18B may occur as a result of the level difference suppression effect by the alignment part 24 in the float part 52 being canceled out.

The support parts 40A and 40B forming the attachment parts 25 in this embodiment support the support plates 18A and 18B via the floating parts 41A and 41B. Hence, even in the case where there is a level difference between the chassis members 12A and 12B or between the hinge chassis 28A and 28B, the attachment parts 25 can absorb such a level difference by the floating parts 41A and 41B. Consequently, the portable information device 10 can support the support plates 18A and 18B by the attachment parts 25 while maintaining flatness between the support plates 18A and 18B aligned by the alignment part 24, and thus can support the display more stably. In particular, the support plates 18A and 18B in this embodiment are carbon fiber-reinforced resin plates (CFRP), and accordingly have very high flatness and rigidity. Hence, the support plates 18A and 18B can maintain high flatness even though both ends are supported in a floating state.

The floating parts 41A and 41B are provided in the support parts 40A and 40B forming the attachment parts 25 closest to the edges 18Aa and 18Ba from among the plurality of attachment parts 25 and 26. Therefore, a level difference between the edges 18Aa and 18Ba can be absorbed more reliably. The floating parts 41A and 41B may be provided in the other attachment parts 26, in addition to the attachment parts 25. At least part of the attachment parts 26 is, however, preferably a structure of rigidly fixing the support plates 18A and 18B to the chassis members 12A and 12B. This enhances the stability of the support plates 18A and 18B and the display 16.

At least one of the first support part 40A and the second support part 40B may include the floating part. An example is that the first support part 40A includes the floating part 41A and the second support part 40B is a rigid support structure without the floating part 41B. Even in such a case, as a result of the first support plate 18A floating by the floating part 41A, any level difference between the first support plate 18A and the second support plate 18B can be absorbed. Another example is that the first support part 40A does not include the floating part 41A and the second support part 40B includes the floating part 41B.

Next, when closing the structure from the use form illustrated in FIG. 4A to the storage form illustrated in FIG. 4B, the locking pieces 22 and 23 of the alignment part 24 separate from the back surfaces 18Bb and 18Ab on the other side, and therefore do not hinder smooth closing operation of the chassis members 12A and 12B and the support plates 18A and 18B. In the storage form illustrated in FIG. 4B, the edges 18Aa and 18Ba of the support plates 18A and 18B and their surroundings are subjected to a force in the direction opposite to the bending direction, due to a reaction force F from the bent part of the display 16. As a result, the support plates 18A and 18B can move toward the inner surfaces 12Ac and 12Bc of the chassis members 12A and 12B by a distance corresponding to the gap 48 which is the floating amount of the floating parts 41A and 41B of the attachment parts 25. Hence, the bent part of the display 16 increases in curvature radius by the amount of outward bulging of the support plates 18A and 18B, as illustrated in FIG. 4B. This reduces the bending load on the display 16, and prevents time degradation of the display 16.

Figure 7:
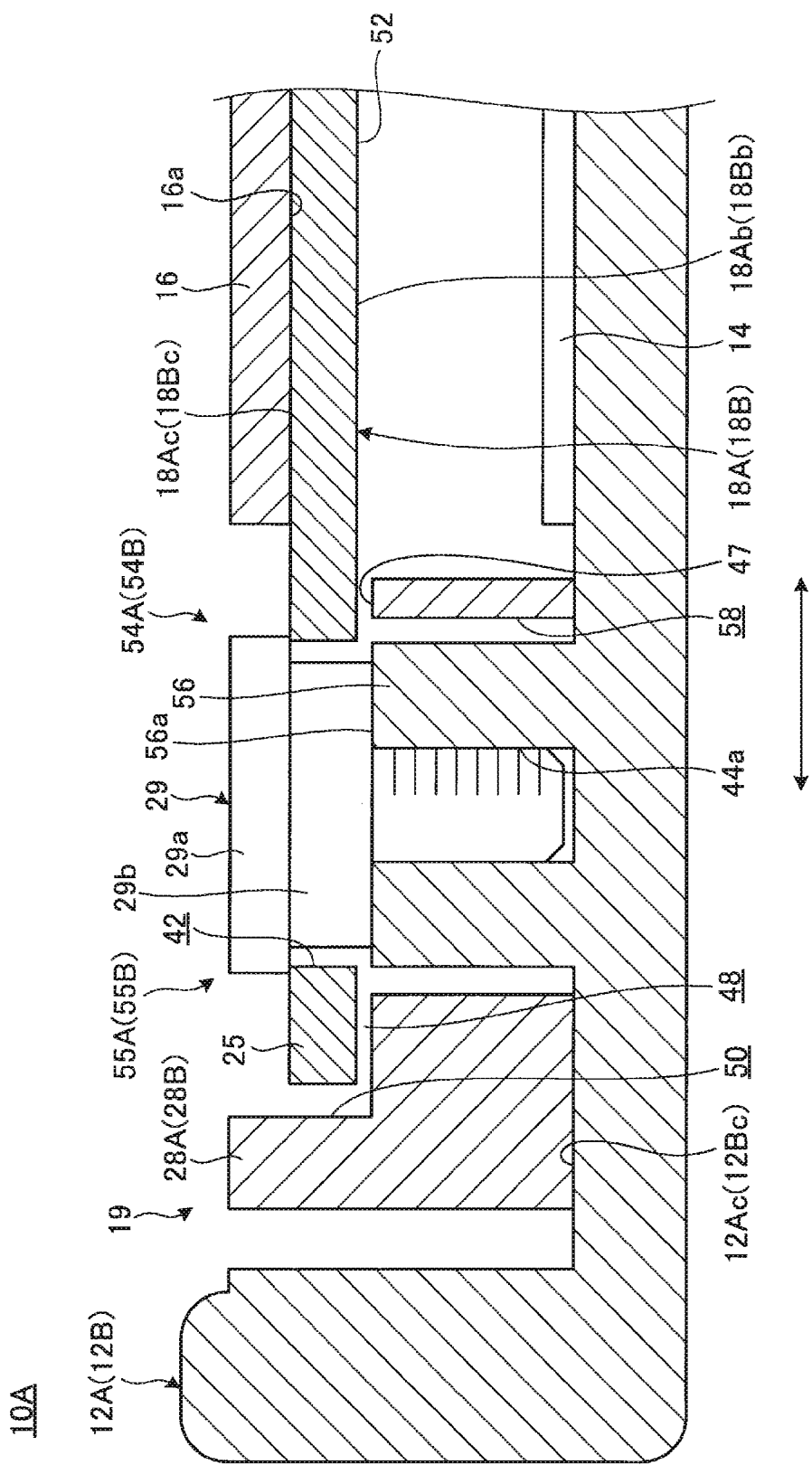
FIG. 7 is an enlarged sectional side view of principal parts of a portable information device including a floating part according to a modification.

FIG. 7 is an enlarged sectional side view of principal parts of a portable information device 10A including support parts 54A and 54B according to a modification. The first support part 54A in this modification includes a floating part 55A in which the shaft member 44 and the first stopper 46 of the first support part 40A illustrated in FIG. 6 have been replaced with a step part 29b and a head 29a, as illustrated in FIG. 7. That is, each attachment screw 29 in the portable information device 10A is a stepped screw having, between the head 29a and the screw part, the step part 29b smaller in diameter than the head 29a and larger in diameter than the screw part.

In the portable information device 10A, the support plate 18A (18B) is supported not by the hinge chassis 28A (28B) but by a boss part 56 protruding from the inner surface 12Ac (12Bc) of the chassis member 12A (12B). That is, each of the hinge chassis 28A and 28B in the portable information device 10A has a through hole 58 in the plate thickness direction, and the boss part 56 is inserted through the through hole 58. The attachment screw 29 is fastened to the internal thread 44a formed in the boss part 56 in a state in which the lower surface of the step part 29b is in contact with the top surface 56a of the boss part 56.

In the floating part 55A of the first support part 54A, the step part 29b of the attachment screw 29 is inserted through the hole part 42 of the attachment part 25 so as to be relatively movable, and thus functions as a shaft member for guiding floating of the attachment part 25. Moreover, in the floating part 55A, the head 29a of the attachment screw 29 functions as the first stopper for preventing the attachment part 25 from coming off upward. The second support part 54B can have the same structure as the first support part 54A, and accordingly its detailed description is omitted. That is, as indicated by the parenthesized reference signs in FIG. 7, the second support part 54B equally includes the floating part 55B including the hole part 42, the boss part 56 functioning as the shaft member, the head 29a functioning as the first stopper, the second stopper 47, and the gap 48.

Therefore, in the portable information device 10A, too, floating of the support plates 18A and 18B for the gap 48 of the floating parts 55A and 55B is allowed, so that a level difference in the attachment part 25 can be suppressed. In the portable information device 10A, too, at least one of the first support part 54A and the second support part 54B may include the floating part.

As has been described, the present invention provides an improved portable information device having a pair of foldable chassis members.

The present invention is not limited to the above-mentioned embodiment, and changes can be freely made without departing from the scope of the present invention.

For example, although the above-mentioned embodiment describes an example in which the portable information device 10 has a structure in which the attachment parts 25 of the support plates 18A and 18B are supported by the hinge chassis 28A and 28B, the portable information device 10 may have a structure in which the attachment parts 25 are directly supported by the chassis members 12A and 12B (i.e., their boss parts 56), as in the portable information device 10A illustrated in FIG. 7. In this case, for example, each boss part 56 is longer than in the structure illustrated in FIG. 7, i.e., long enough to be inserted from the through hole 58 through to the hole part 42.

Although the above-mentioned embodiment describes an example in which the locking pieces 22 and 23 are used as the alignment part 24, the alignment part 24 may have any other structure as long as a level difference between the support plates 18A and 18B in the use form can be suppressed. For example, the alignment part may have a structure in which magnets 60N whose north pole faces the second support plate 18B are arranged at the edge 18Aa of the first support plate 18A and magnets 60S whose south pole faces the first support plate 18A are arranged at the edge 18Ba of the second support plate 18B, as indicated by dashed-two dotted lines in FIG. 5. With this alignment part, a level difference between the support plates 18A and 18B can be suppressed in the use form as a result of the magnets 60N and 60S attracting each other.

Although the above-mentioned embodiment describes an example in which the floating parts 41A and 41B or 55A and 55B floating-support the support plates 18A and 18B by air cushion in the gap 48, a cushioning material such as a highly flexible rubber or sponge may be provided in the gap 48.

Although the above-mentioned embodiment describes an example in which the support parts 40A and 40B, etc. are provided at both ends of the edges 18Aa and 18Ba of the support plates 18A and 18B, the support parts 40A and 40B, etc. may be provided at the longitudinal center of the edges 18Aa and 18Ba and its surroundings. That is, any structure may be used as long as at least a part of the edges 18Aa and 18Ba of the support plates 18A and 18B is aligned by the alignment part 24 or the like and another part of the edges 18Aa and 18Ba is floating-supported by the support parts 40A and 40B or the like. The hinge mechanism 19 may be provided at the longitudinal center of the edges 18Aa and 18Ba and its surroundings.

Although the above-mentioned embodiment describes an example in which the portable information devices 10 and 10A are clamshell-foldable like a book, the present invention is also applicable to various structures other than a structure of clamshell-folding chassis members of the same shape, such as a double door structure in which respective small-sized chassis members are foldably connected to the left and right edges of a large-sized chassis member, an S-type folding structure in which respective chassis members different in folding direction are connected to the left and right edges of one chassis member, and a J-type folding structure in which a small-sized chassis member is foldably connected to one of the left and right edges of a large-sized chassis member. The number of connections of chassis members may be four or more.

While the invention has been particularly shown and described with reference to a preferred embodiment, it will be understood by those skilled in the art that various changes in form and detail may be made therein without departing from the spirit and scope of the invention.

What is claimed is:

1. A portable information device comprising:
   a first and second chassis members;
   a hinge mechanism rotatably connects said first and second chassis members to allow said first and second chassis members to change between a flat form in which said first and second chassis members are arranged side-by-side and a stacked form in which said first and second chassis members are overlapped each other;
   a first support plate located at an inner surface of said first chassis member;
   a second support plate located at an inner surface of said second chassis member to be adjacent to said first support plate;
   a display supported by front surfaces of said first and second support plates;
   an alignment part aligns said front surfaces between one edge of said first support plate and one edge of said second support plate adjacent to each other, when said chassis members are in said flat form;
   a first support part supports said first support plate relative to said first chassis member; and
   a second support part supports said second support plate relative to said second chassis member, wherein at least one of said first and second support parts includes a floating part that supports a corresponding support plate relative to a corresponding chassis member in a floating state.

2. The portable information device of claim 1, wherein each of said first and second support parts includes said floating part.

3. The portable information device of claim 1, wherein said first support plate is attached to said first chassis member via a plurality of first attachment parts, and at least one of said first attachment parts closest to said one edge of said first support plate is composed of said first support part.

4. The portable information device of claim 3, wherein said second support plate is attached to said second chassis member via a plurality of second attachment parts, and at least one of said second attachment parts closest to said one edge of said second support plate is composed of said second support part.

5. The portable information device of claim 3, wherein at least part of said plurality of first attachment parts rigidly fixes said first support plate and said first chassis member to each other.

6. The portable information device of claim 5, wherein at least part of said plurality of second attachment parts rigidly fixes said second support plate and said second chassis member to each other.

7. The portable information device of claim 1, wherein said first support part is provided at each of both longitudinal ends of said one edge of said first support plate, said second support part is provided at each of both longitudinal ends of said one edge of said second support plate, and said alignment part is provided at a position between both longitudinal ends of said one edge of said first support plate and said one edge of said second support plate.

8. The portable information device of claim 5, wherein said first support plate and said second support plate each include a float part in a state of floating from a corresponding one of said inner surfaces of said first chassis member and said second chassis member, at a position between both longitudinal ends of said one edge, said float part being provided with said alignment part.

9. The portable information device of claim 1, wherein said hinge mechanism includes
   a first hinge chassis fixed to said inner surface of said first chassis member;
   a second hinge chassis fixed to said inner surface of said second chassis member; and a hinge shaft rotatably connects said first hinge chassis and said second hinge chassis.

10. The portable information device of claim 9, wherein said first support part supports said first support plate relative to said first hinge chassis, and said second support part supports said second support plate relative to said second hinge chassis.

11. The portable information device of claim 1, wherein said floating part includes a hole part formed in at least said first support plate;

a shaft member inserted through said hole part so as to be relatively movable in a shaft direction;

a first stopper provided at one end of said shaft member and prevents the first support plate from coming off said one end;

a second stopper provided at an other end of said shaft member and prevents said first support plate from coming off said other end; and a spacing between said first stopper and said second stopper is greater than a length of said hole part in said shaft direction.

12. The portable information device of claim 1, wherein said display extends from said first support plate to said second support plate, and has a foldable single sheet shape.

* * * * *